(12) United States Patent
Mason et al.

(10) Patent No.: US 12,412,616 B2
(45) Date of Patent: Sep. 9, 2025

(54) PROBABILISTIC DATA INTEGRITY SCANS USING RISK FACTOR ESTIMATION

(71) Applicant: Micron Technology, Inc., Boise, ID (US)

(72) Inventors: Robert Winston Mason, Boise, ID (US); Phani Raghavendra Yasasvi Gangavarapu, Bengaluru (IN); Pitamber Shukla, Boise, ID (US); Qun Su, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 134 days.

(21) Appl. No.: 18/507,872

(22) Filed: Nov. 13, 2023

(65) Prior Publication Data

US 2024/0177760 A1 May 30, 2024

Related U.S. Application Data

(60) Provisional application No. 63/385,209, filed on Nov. 28, 2022.

(51) Int. Cl.
*G11C 11/406* (2006.01)
*G11C 29/02* (2006.01)

(52) U.S. Cl.
CPC .. *G11C 11/40615* (2013.01); *G11C 11/40622* (2013.01); *G11C 29/022* (2013.01)

(58) Field of Classification Search
CPC ........ G11C 11/40615; G11C 11/40622; G11C 29/022; G11C 29/4401; G11C 2029/4402
See application file for complete search history.

(56) References Cited

U.S. PATENT DOCUMENTS

| | | | |
|---|---|---|---|
| 2015/0169403 A1* | 6/2015 | Yen | G06F 11/0757 714/760 |
| 2020/0097211 A1* | 3/2020 | Alsasua | G06F 3/064 |
| 2022/0044744 A1* | 2/2022 | Wang | G11C 16/08 |
| 2022/0237078 A1* | 7/2022 | Cadloni | G06F 12/1081 |

* cited by examiner

*Primary Examiner* — Jay W. Radke
(74) *Attorney, Agent, or Firm* — NICHOLSON DE VOS WEBSTER & ELLIOTT LLP

(57) ABSTRACT

Methods, systems, and apparatuses include determining a read counter for a portion of memory of a memory device satisfies a read threshold. A weighted subportion identifier for the portion of memory is selected in response to the read counter satisfying the threshold. The weighted subportion identifier is selected probabilistically, a probability of selection based on defectivity information for subportions of memory of the portion of memory. A subportion of memory is determined using the weighted subportion identifier. A data validity scan is performed on the subportion of memory.

20 Claims, 5 Drawing Sheets

PROBABILISTIC DATA INTEGRITY SCANS USING RISK FACTOR ESTIMATION

CROSS-REFERENCE TO RELATED APPLICATION

The present application claims the benefit of U.S. Provisional Patent Application No. 63/385,209 filed on Nov. 28, 2022, which is incorporated by reference herein in its entirety.

TECHNICAL FIELD

The present disclosure generally relates to probabilistic data integrity scans, and more specifically, relates to probabilistic data integrity scans using risk factor estimation.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
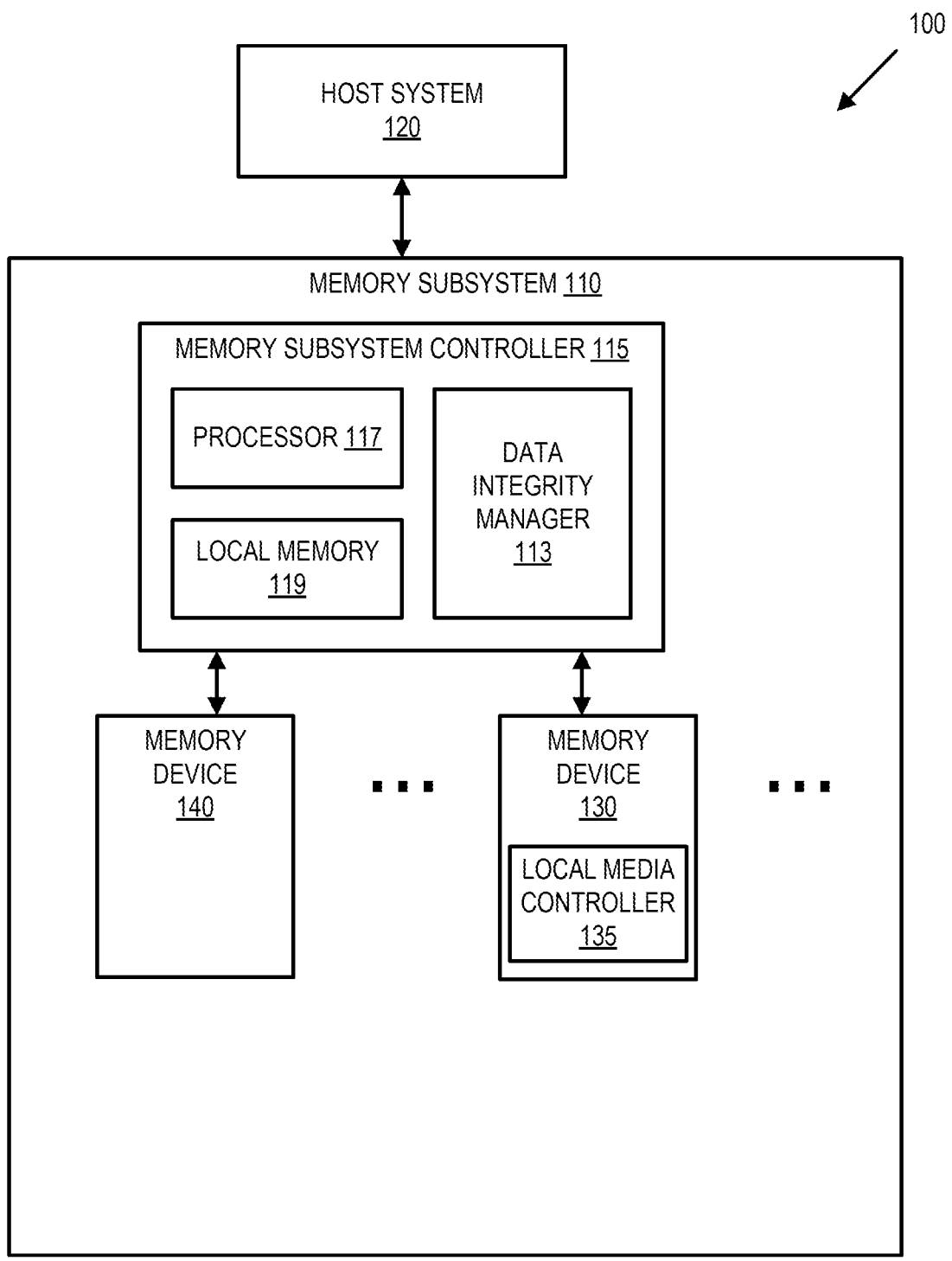
FIG. 1 illustrates an example computing system that includes a memory subsystem in accordance with some embodiments of the present disclosure.

Aspects of the present disclosure are directed to managing the frequency of data integrity scans using risk factor estimation in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, an SLC can store one bit of information and has two logic states.

Data reliability in a memory can degrade as the memory device increases in density (e.g., device components scale down in size, when multiple bits are programmed per cell, etc.). One contributor to this reduction in reliability is read disturb. Read disturb occurs when a read operation performed on one portion of the memory (e.g., a row of cells), often referred to as the aggressor, impacts the threshold voltages in another portion of memory (e.g., a neighboring row of cells), often referred to as the victim. Memory devices typically have a finite tolerance for these disturbances. A sufficient amount of read disturb effects can change the victim cells in the other/unread portion of memory to different logical states than originally programmed, which results in errors.

Memory subsystems can use read counters to measure how many times the wordlines in a block have been read and execute a read disturb scan (also called a data integrity scan) when the counter reaches a threshold value. The threshold value for the counter is conventionally set to the worst case of stress caused by read disturb, e.g., as a function of gate voltage for the wordline that has the greatest read disturb stress under repeated read operations, referred to as row hammer stress. Given that the amount of stress caused by read disturb can vary for different portions of memory and different read patterns, read disturb scans triggered based on the worst-case scenario often occur when there is not a high likelihood of read disturb at a level that would cause problems. While a read disturb may not lead to refreshing a portion of memory, these read disturb scans can cause host collisions and impact the quality of service (QOS) of the system.

Aspects of the present disclosure address the above and other deficiencies by implementing a probabilistic data integrity scheme to manage the frequency of data integrity scans using risk factor estimation. For example, the frequency of data integrity scans for a memory block is based on a probabilistic determination of the memory block using an initial read window budget of one or more wordline groups in the memory block and the number of program erase cycles for the memory block. Each wordline or group of wordlines within the memory block may have different sensitivities to the application of a gate voltage due to variabilities introduced during manufacturing. By accounting for these different sensitivities rather than, e.g., using the worst case read disturb stress, the frequency of data integrity scans can be reduced. As a result, the system can reduce host collisions and improve QoS.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IOT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory device 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a data integrity manager 113 that can manage the frequency of data integrity scans using risk factor estimation. In some embodiments, the controller 115 includes at least a portion of the data integrity manager 113. For example, the controller 115 can include a processing device 117 configured to execute instructions stored in local memory 119 for performing the operations described herein. In some embodiments, a data integrity manager 113 is part of the host system 120, an application, or an operating system.

The data integrity manager 113 can determine the frequency of data integrity scans for a portion of memory based on a probabilistic determination of the riskiest subportion in the portion of memory using an initial read window budget and the number of program erase cycles for the portion of memory. Further details with regard to the operations of the data integrity manager 113 are described below.

Figure 2:
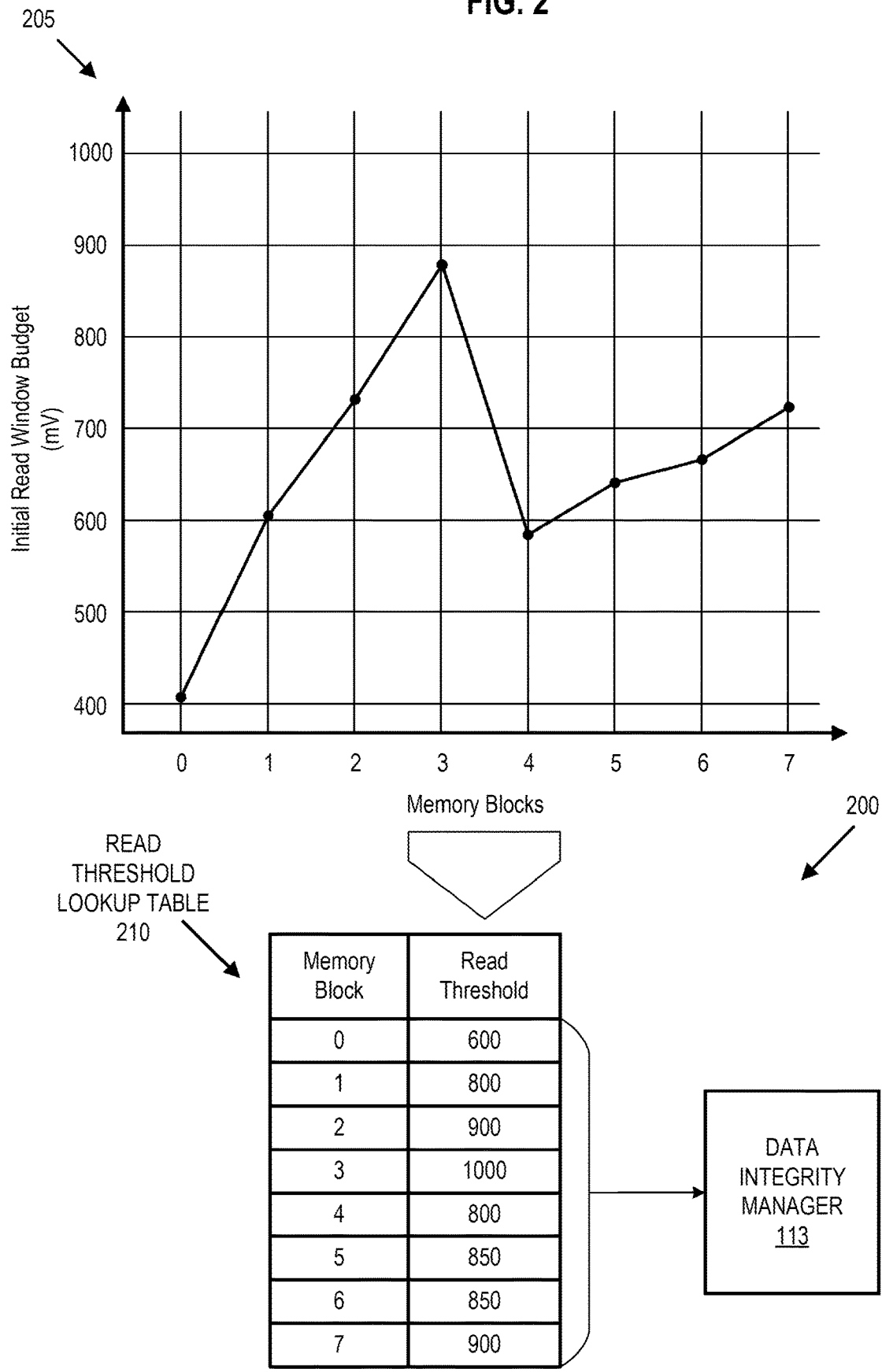
FIG. 2 illustrates an example system for managing the frequency of data integrity scans using risk factor estimation in accordance with some embodiments of the present disclosure.

FIG. 2 illustrates an example computing system 200 for managing the frequency of data integrity scans using risk factor estimation in accordance with some embodiments of the present disclosure. FIG. 2 includes a read window budget graph 205 representing different initial read window budget (RWB) values for different memory blocks which can be used to determine read threshold values in read threshold lookup table 210. Read window budget graph 205 is illustrated as an example for visualization to show how different memory blocks can have different initial RWBs. The initial RWBs vary from memory block to memory block, e.g., based on manufacturing variabilities, such as the thickness of material deposited. As shown in read window budget graph 205, RWBs are measured in millivolts (mV) or similar metrics.

While the illustrated example and associated disclosure mention memory blocks as the portion of memory used, embodiments can use different portions of memory in a memory device, such as memory dice, groups of wordlines, individual wordlines, among others. In some embodiments, portions of memory with similar initial RWBs are placed into groups such that each group corresponds with a different initial RWB.

The computing system 200 includes a read threshold lookup table 210 (or similar data structure). Read threshold lookup table 210 is stored in memory, such as local memory 119 or memory device 140 of FIG. 1. In some embodiments, read threshold lookup table 210 is written to memory based on known initial RWB information (e.g., defectivity information) for the memory blocks, e.g., from manufacturing data, initial testing, etc. For example, read threshold lookup table 210 includes different read thresholds based on known RWB information mapped to different memory blocks of a memory device (e.g., memory device 140 of FIG. 1).

In some embodiments, data integrity manager 113 updates read threshold lookup table 210 based on the program erase cycles for the memory blocks. For example, data integrity manager 113 reduces the read threshold of a memory block at certain threshold levels of program erase cycles for the memory block. In some embodiments, data integrity manager 113 performs a data integrity scan and updates read threshold lookup table 210 based on the results. For example, data integrity manager 113 performs a data integrity scan on a memory block to estimate the current RWB and updates the read threshold for the memory block in read threshold lookup table 210 based on the estimated RWB. In some embodiments, rather than estimating the RWB using a data integrity scan, data integrity manager 113 estimates the RWB for a memory block based on the initial RWB and a measure of the wear on the memory block, such as program erase cycles, number of reads, or elapsed time.

In some embodiments, data integrity manager 113 performs the data integrity scan and subsequent updating of read threshold lookup table 210 in response to refreshing a memory block. For example, when data integrity manager 113 refreshes a memory block, data integrity manager 113 also performs a data integrity scan, determines an updated read threshold for the memory block and updates read threshold lookup table 210 accordingly.

Figure 3:
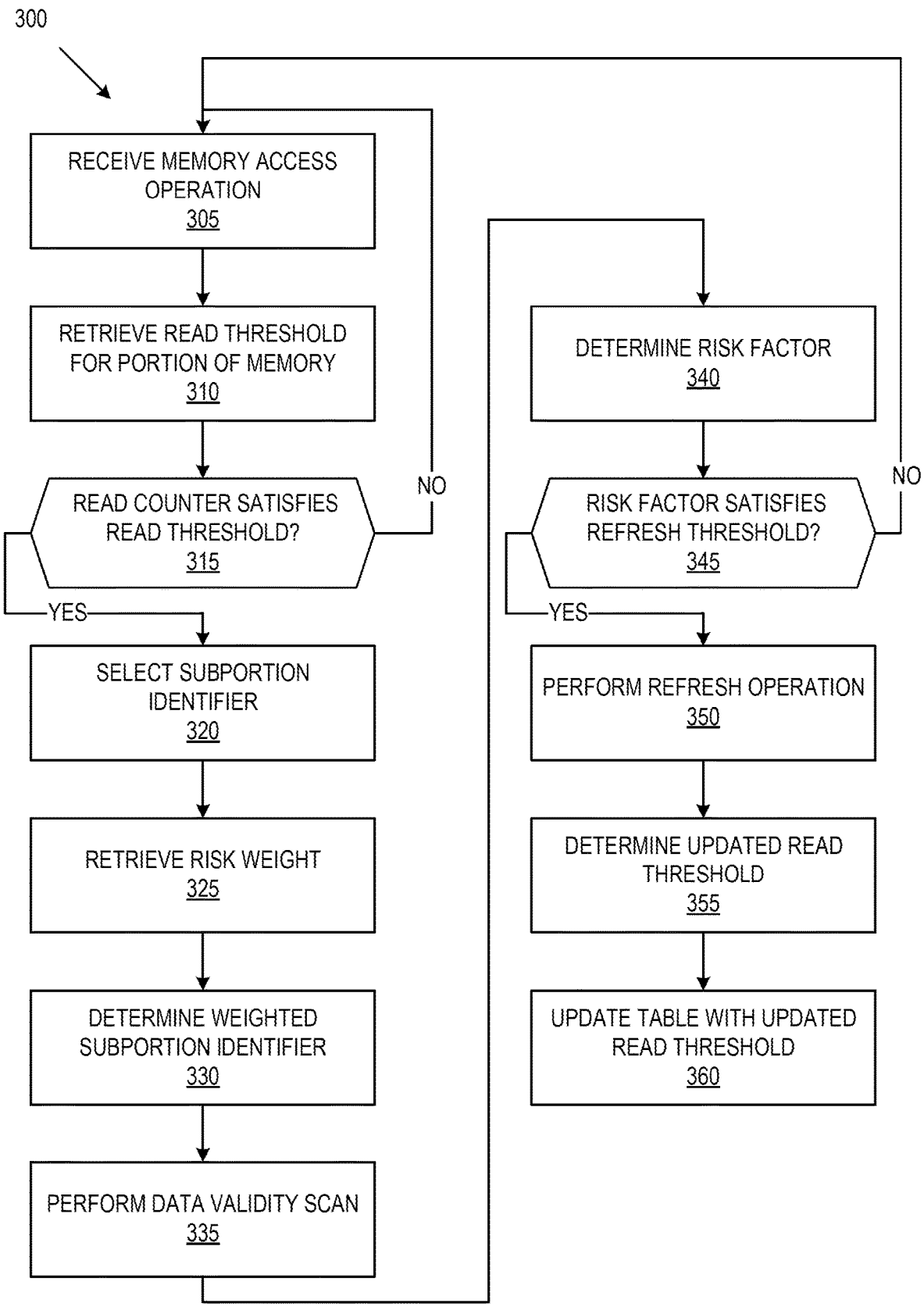
FIG. 3 is a flow diagram of an example method to manage the frequency of data integrity scans using risk factor estimation in accordance with some embodiments of the present disclosure.

FIG. 3 is a flow diagram of an example method 300 to manage the frequency of data integrity scans using risk factor estimation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives a memory access operation. For example, data integrity manager 113 receives a read or write command from a host device, such as host system 120 of FIG. 1. The read or write command includes a logical address which the processing device translates into a physical address and identifies the portion of memory which the command targets. The processing device also reads/receives the read counter for the portion of memory. For example, data integrity manager 113 retrieves the read counter from a stored location, such as local memory 119 or memory device 140 of FIG. 1 using the memory block. In some embodiments, the processing device retrieves the read counter using the physical address.

The read counter indicates how many read operations have occurred in a given portion of memory. As mentioned above, different sizes may be used for the portion of memory, such as a wordline read counter, a wordline group read counter, a block read counter, a plane read counter, a super block read counter, and a LUN read counter, among others.

At operation 310, the processing device retrieves the read threshold for the portion of memory. For example, data integrity manager 113 accesses a data structure such as read threshold lookup table 210 of FIG. 2 and retrieves a read threshold for the portion of memory identified at operation 305. In some embodiments, the processing device uses the physical address to retrieve the applicable read threshold rather than the memory block. While the illustrated example mentions memory blocks as the portions of memory used, embodiments can use different portions of memory in a memory device, such as memory dice, groups of wordlines, individual wordlines, and others.

At operation 315, the processing device determines whether the read counter satisfies the read threshold. For example, data integrity manager 113 compares the retrieved read threshold for the memory block with the received read counter for the memory block and determines whether the read counter is greater than or equal to the read threshold. If the read counter satisfies the read threshold, the method 300 proceeds to operation 320. If the read counter does not satisfy the read threshold, the method 300 returns to operation 305.

At operation 320, the processing device selects a subportion identifier. For example, data integrity manager 113 generates a number using a random process that identifies a subportion of memory within the portion of memory. In some embodiments, rather than using a random process, the processing device uses a process that is independent of the number of subportions. For example, the processing device may use a predetermined order of subportion identifiers and identifies the next subportion in the predetermined order. The subportion is a unit of memory smaller than the portion used to track the read threshold and the read counter. For example, if read thresholds are stored for each memory block, the subportion of memory may be a wordline group or an individual wordline. In some embodiments, the processing device generates the random number in a range that includes the subportions of memory within the portion of memory. For example, there are twelve wordlines groups within the memory block and the processing device generates a random number between one and twelve.

At operation 325, the processing device retrieves a risk weight. For example, data integrity manager 113 accesses a data structure and retrieves a risk weight for the generated subportion identifier. The data structure which stores the risk weights is stored in memory, such as local memory 119 or memory device 140 of FIG. 1. In some embodiments, the risk weights are written to memory based on known defectivity information for subportions of memory, e.g., from manufacturing data, initial testing, etc. For example, the risk weights for a wordline group located in an area with high RWB (more reliable) will be weighted to push the selection away from that wordline group and towards a wordline group in an area with low RWB (less reliable).

In some embodiments, the risk weight is an amount to increment or decrement the subportion identifier based on the location of the subportion identifier within the portion of memory. For example, the portion of memory is a memory block and there are twelve wordline groups (subportions) within the memory block. The memory block has a higher probability of defects in the top, middle, and bottom. The risk weights for the top three wordline groups will decrement the subportion identifier to push it closer to the top of the memory block. Similarly, the risk weights for the next three wordline groups will increment the subportion identifier to push it closer to the middle of the memory block. In some embodiments, the size of the decrement or increment will decrease depending on the proximity of the wordline group to the areas of defectivity. For example, the wordline groups closest to the areas of defectivity (first wordline group, last wordline group, and wordline groups in the middle) have a small increment/decrement whereas the wordline groups farthest from the areas of defectivity will have a large increment/decrement.

In some embodiments, the risk weight is a multiplier applied to the subportion identifier based on the location of the subportion identifier within the portion of memory. For example, the portion of memory is a memory block and there are twelve wordline groups (subportions) within the memory block. The risk weights for the top three wordline groups will be less than one, such that the weighted subportion identifier for these wordline groups is closer to the top of the memory block than the respective subportion identifier. Similarly, the risk weights for the next three wordline groups will be greater than one, such that the weighted subportion identifier for these wordline groups is closer to the middle of the memory block than the respective subportion identifier. In some embodiments, the risk weight also changes based on the proximity of the wordline group to the areas of defectivity. For example, the wordline groups closest to the areas of defectivity (first wordline group, last wordline group, and wordline groups in the middle) will have a risk weight closer to one, whereas the wordline groups farthest from the areas of defectivity will have a risk weight farther from one.

In some embodiments, the processing device determines whether to apply the risk weights probabilistically. For example, the processing device determines whether to apply the risk weights based on the location of the subportion identifier within the portion of memory. In some embodiments, the processing device determines whether to apply the risk weight or keep the wordline the same according to a probability for the subportion identifier. For example, for a given wordline group, the processing device will increment/decrement the wordline selected 80% of the time. In some embodiments, the wordline groups closest to the areas of defectivity have a higher probability of applying the risk weight whereas the wordline groups farthest from the areas of defectivity have a lower probability of applying the risk weight.

In some embodiments, the processing device determines the risk weights probabilistically. For example, the processing device has a probability for selecting different increment/decrement values based on the location of the subportion identifier within the portion of memory. In some embodiments, the wordline groups closest to the areas of defectivity (first wordline group, last wordline group, and wordline groups in the middle) have a higher probability of a small increment/decrement whereas the wordline groups farthest from the areas of defectivity will have a higher probability of a large increment/decrement. In other embodiments, the wordline groups closest to the areas of defectivity (first wordline group, last wordline group, and wordline groups in the middle) will have a higher probability of a risk weight closer to one, whereas the wordline groups farthest from the areas of defectivity will have a higher probability of a risk weight farther from one.

In some embodiments, the risk weights are incorporated into the generation of the subportion identifier. For example, the subportion identifier is selected and subportions of memory with a higher probability of defectivity are more likely to be chosen than subportions of memory with a lower probability of defectivity.

At operation 330, the processing device determines a weighted subportion identifier. For example, data integrity manager 113 determines a weighted subportion identifier using the generated subportion identifier and the retrieved risk weight. Referring to the example above, the weighted subportion identifier is more likely to identify an area with low RWB or with a higher probability of defectivity than the subportion identifier. The processing device therefore is more likely to select a subportion that is an area with low RWB.

In some embodiments, the processing device tracks a list of previous subportions of memory that were checked and the method 300 will return to operation 320 if the determined weighted subportion identifier matches a subportion in the list of previous subportions. This prevents the processing device from repeatedly checking the same subportion causing further RWB degradation for that subportion. The number of previous subportions tracked by the list may vary depending on the requirements of the system. For example, systems with higher data validity requirements may have a longer list than systems with lower data validity requirements. Similarly, systems with less available storage may have a short list than systems with more available storage.

At operation 335, the processing device performs a data validity scan. For example, data integrity manager 113 uses the weighted subportion identifier to identify a subportion of the portion of memory and performs a data validity scan on the determined subportion of memory to determine a number of errors in the subportion of memory. In some embodiments, the processing device selects one or more portions of memory within the subportion of memory and performs a data validity scan to estimate the number of errors in the subportion of memory. For example, if the subportion of memory is a wordline group, data integrity manager 113 can perform a data validity scan on a subset of the wordlines in the wordline group. In some embodiments, the processing device estimates a number of errors in the portion of memory based on the number of errors in the subportion of memory.

At operation 340, the processing device determines a risk factor for the portion of memory. For example, data integrity manager 113 determines the risk factor as bit error rate or other representation of the number of errors in the subportion of memory. In some embodiments, the processing device determines the risk factor as the estimated number of errors in the portion of memory.

At operation 345, the processing device determines whether the risk factor satisfies a refresh threshold. For example, data integrity manager 113 determines whether the determined number of errors for the subportion of memory from the data integrity scan satisfies the refresh threshold indicating the number of errors in the subportion of memory at which to perform a refresh operation. In some embodiments, the refresh threshold indicates the number of errors in the portion of memory at which to perform a refresh operation. In some embodiments, the refresh threshold is prestored in memory and may be based on system requirements. For example, systems with higher data validity requirements will have refresh thresholds lower than systems with lower data validity requirements, causing refresh operations to execute more frequently.

In some embodiments, the processing device uses the estimated number of errors for the portion of memory and the refresh threshold for the portion of memory. If the risk factor satisfies the refresh threshold, the method 300 proceeds to operation 350. If the risk factor does not satisfy the refresh threshold, the method 300 returns to operation 305.

In some embodiments, when the risk factor does not satisfy the refresh threshold, the method 300 proceeds to operation 355 and then operation 360 before returning to operation 305. For example, the processing device the processing device determines whether to proceed to operation 355 or 305 based on the program erase cycles for the portion of memory. If the program erase cycles for the portion of memory satisfy a threshold update value, the method 300 proceeds to operation 355 and then to operation 360. If, however, the program erase cycles for the portion of memory do not satisfy a threshold update value, the method 300 returns to operation 305.

At operation 350, the processing device performs a refresh operation. For example, data integrity manager 113 uses an error correction scheme to rewrite the data for the portion of memory (e.g., to a different block).

At operation 355, the processing device optionally determines an updated read threshold. For example, data integrity manager 113 determines estimated RWBs for the subportion of memory based on the results of the data validity scan. In some embodiments, data integrity manager 113 issues multiple read strobes at different offsets for a given read level. Using these read strobes, data integrity manager 113 determines two read strobes for which the read voltage value for the given read level satisfies an error correction threshold (e.g., a maximum bit error count). Data integrity manager 113 estimates the RWB for the portion of memory using the read strobes (e.g., a difference in voltage between the two read strobes).

In some embodiments, the processing device estimates an updated read threshold for the portion of memory based on the initial RWB and the program erase cycles. As program erase cycles for a portion of memory increase, the RWB for that portion of memory tends to decrease, and the read threshold should therefore decrease as well allowing for more frequent data integrity scans. After a refresh operation, however, the RWB for a portion of memory tends to recover and increase and the processing device therefore increases the read threshold, allowing for less frequent data integrity scans.

In some embodiments, the processing device updates the table with updated read threshold at set points. For example, data integrity manager 113 updates the table in response to determining that the program erase cycles for a memory block, time elapsed, etc. satisfy an update threshold.

At operation 360, the processing device updates the table with the updated read threshold. For example, data integrity manager 113 updates a data structure such as read threshold lookup table 210 of FIG. 2 for the scanned memory block using the estimated RWB. In some embodiments, the processing device also updates the risk weights for the subportions of memory. For example, the processing device uses the updated RWB for a subportion of memory to update the previous risk weights for that subportion of memory. The processing device may therefore change the risk weights from their previous setting based on program erase cycles and similar measurements.

Figure 4:
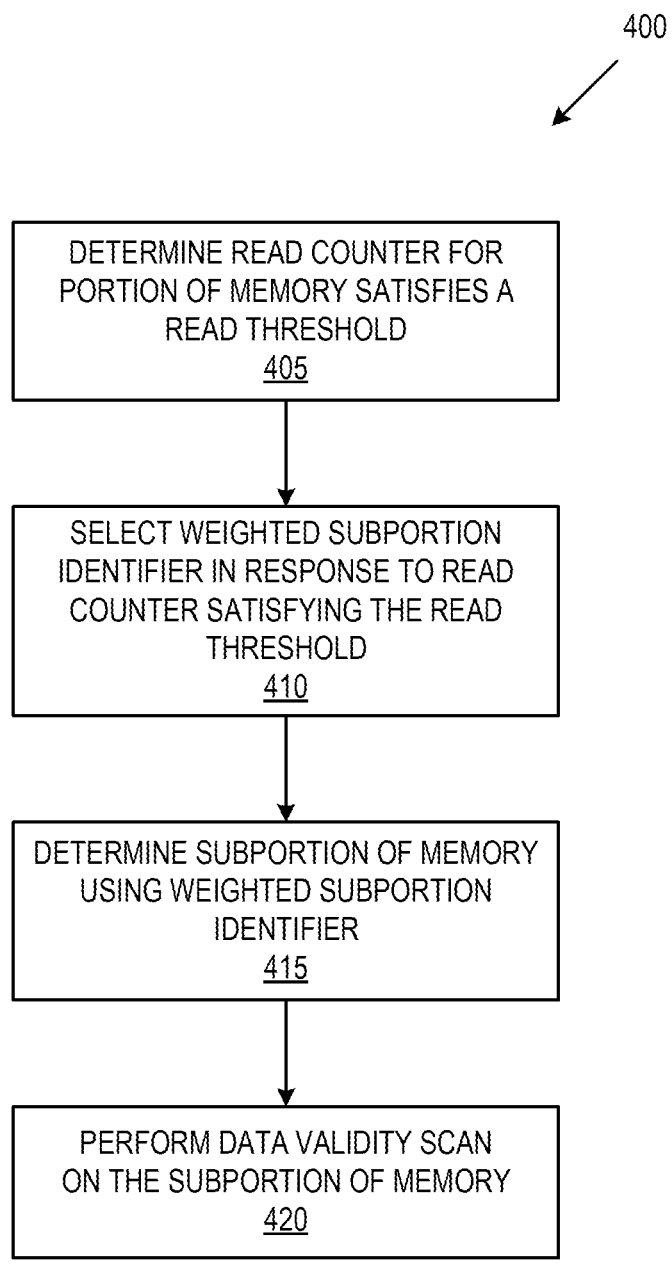
FIG. 4 is another flow diagram of an example method to manage the frequency of data integrity scans using risk factor estimation in accordance with some embodiments of the present disclosure.

FIG. 4 is a flow diagram of an example method 400 to manage the frequency of data integrity scans using risk factor estimation, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device determines that the read counter for a portion of memory satisfies a read threshold. For example, data integrity manager 113 receives a memory access operation, such as a read or write command from a host device (e.g., host system 120 of FIG. 1). The memory access operation includes a logical address which the processing device translates into a physical address and identifies the portion of memory which the command targets. The processing device retrieves the read counter from a stored location using the memory access operation (e.g., using the physical address). The processing device accesses a data structure, such as read threshold lookup table 210 of FIG. 2 and retrieves a read threshold for the portion of memory. The processing device compares the read counter for the memory block with the read threshold for the memory block and determines whether the read counter is greater than or equal to the read threshold. For example, aspects of the read threshold are described with reference to operations 305 through 315 of FIG. 3. If the read counter satisfies the read threshold, the method 400 proceeds to operation 410.

At operation 410, the processing device selects a weighted subportion identifier in response to the read counter satisfying the read threshold. For example, data integrity manager 113 generates a number using a random process that identifies a subportion of memory within the portion of memory. In some embodiments, rather than using a random process, the processing device uses a probabilistic process that is independent of the number of subportions. For example, the processing device may use a predetermined order of subportion identifiers and identifies the next subportion in the predetermined order. The subportion is a unit of memory smaller than the portion used to retrieve the read threshold and receive the read counter. For example, if read thresholds are stored for each memory block, the subportion of memory may be a wordline group or an individual wordline. In some embodiments, the processing device generates the random number in a range that includes the subportions of memory within the portion of memory. For example, there are twelve wordlines groups within the memory block and the processing device generates a random number between one and twelve.

In some embodiments, the processing device probabilistically selects the subportion identifier using defectivity information. For example, data integrity manager 113 uses a probabilistic selection such that it is more likely to choose subportion identifiers identifying subportions of memory with a higher probability of defectivity than subportion identifiers identifying subportions of memory with a lower probability of defectivity. In one embodiment, the selection includes using a weighted random number generation to select a subportion identifier. In another embodiment, the selection includes generating a random number to select a subportion identifier and using a weighting to probabilistically select a weighted subportion identifier, as described above with reference to FIG. 3.

At operation 415, the processing device determines a subportion of memory using the weighted subportion identifier. For example, data integrity manager 113 uses subportion identifier to identify a subportion of the memory block. In some embodiments, the processing device selects the subportion of memory based on risk weights as described with reference to operation 320 through 330 of FIG. 3.

At operation 420, the processing device performs a data validity scan of the subportion of memory. For example, data integrity manager 113 uses the weighted subportion identifier to identify a subportion of the portion of memory and performs a data validity scan on the determined subportion of memory to determine a number of errors in the subportion of memory. In some embodiments, the processing device selects one or more portions of memory within the subportion of memory and performs a data validity scan to estimate the number of errors in the subportion of memory. In some embodiments, the processing device estimates a number of errors in the portion of memory based on the number of errors in the subportion of memory.

Figure 5:
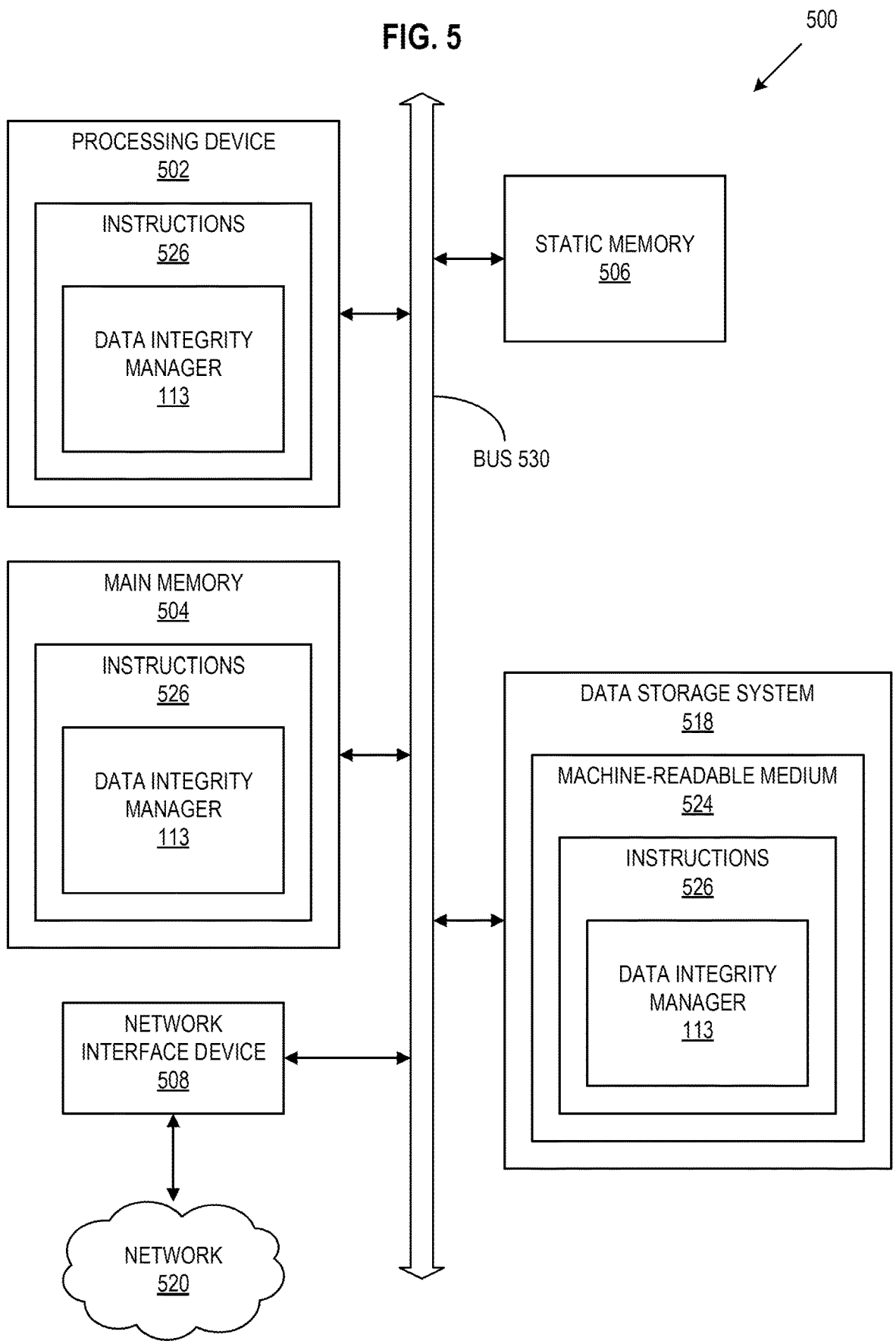
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the data integrity manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a data integrity manager (e.g., data integrity manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    determining a read counter for a portion of memory of a memory device satisfies a read threshold;
    selecting, in response to the read counter satisfying the read threshold, a weighted subportion identifier for the portion of memory, wherein the weighted subportion identifier is selected probabilistically, a probability of selection based on defectivity information for a plurality of subportions of memory of the portion of memory;
    determining a subportion of memory of the plurality of subportions using the weighted subportion identifier; and
    performing a data validity scan on the subportion of memory.

2. The method of claim 1, further comprising:
    determining a risk factor for the portion of memory using a result of the data validity scan;
    determining whether the risk factor satisfies a refresh threshold; and
    performing a refresh operation on the portion of memory in response to the risk factor satisfying the refresh threshold.

3. The method of claim 1, further comprising:
    determining whether a program erase cycle counter for the portion of memory satisfies a program erase threshold; and
    updating the read threshold for the portion of memory in response to the program erase cycle counter satisfying the program erase threshold.

4. The method of claim 1, further comprising:
    retrieving the read threshold for the portion of memory from a data structure for the memory device, wherein the data structure includes a plurality of read thresholds including the read threshold for the portion of memory, wherein another portion of memory is mapped to a read threshold of the plurality of read thresholds that has a different value than the read threshold for the portion of memory.

5. The method of claim 4, further comprising:
    determining an updated read threshold for the portion of memory based on an estimated read window budget for the portion of memory; and
    updating the data structure with the updated read threshold.

6. The method of claim 1, wherein determining the subportion of memory comprises:
    determining a subportion identifier using a random process;
    retrieving a risk weight using the subportion identifier, wherein the risk weight is based on the defectivity information;
    determining the weighted subportion identifier using the subportion identifier and the risk weight; and
    retrieving the subportion of memory from a data structure including the plurality of subportions of memory using the weighted subportion identifier.

7. The method of claim 6, wherein the defectivity information is estimated read window budgets for the plurality of subportions of memory.

8. A non-transitory computer-readable storage medium comprising instructions that, when executed by a processing device, cause the processing device to:
    determine a read counter for a portion of memory of a memory device satisfies a read threshold;
    select, in response to the read counter satisfying the read threshold, a weighted subportion identifier for the portion of memory, wherein the weighted subportion identifier is selected probabilistically, a probability of selection based on defectivity information for a plurality of subportions of memory of the portion of memory;
    determine a subportion of memory of the plurality of subportions using the weighted subportion identifier; and
    perform a data validity scan on the subportion of memory.

9. The non-transitory computer-readable storage medium of claim 8, wherein the processing device is further to:
    determine a risk factor for the portion of memory using a result of the data validity scan;
    determine whether the risk factor satisfies a refresh threshold; and
    perform a refresh operation on the portion of memory in response to the risk factor satisfying the refresh threshold.

10. The non-transitory computer-readable storage medium of claim 8, wherein the processing device is further to:
    determine whether a program erase cycle counter for the portion of memory satisfies a program erase threshold; and
    update the read threshold for the portion of memory in response to the program erase cycle counter satisfying the program erase threshold.

11. The non-transitory computer-readable storage medium of claim 8, wherein the processing device is further to:
    retrieve the read threshold for the portion of memory from a data structure for the memory device, wherein the data structure includes a plurality of read thresholds including the read threshold for the portion of memory, wherein another portion of memory is mapped to a read threshold of the plurality of read thresholds that has a different value than the read threshold for the portion of memory.

12. The non-transitory computer-readable storage medium of claim 11, wherein the processing device is further to:
    determine an updated read threshold for the portion of memory based on an estimated read window budget for the portion of memory; and
    update the data structure with the updated read threshold.

13. The non-transitory computer-readable storage medium of claim 8, wherein determining the subportion of memory comprises:
    determining a subportion identifier using a random process;

retrieving a risk weight using the subportion identifier, wherein the risk weight is based on the defectivity information;

determining the weighted subportion identifier using the subportion identifier and the risk weight; and retrieving the subportion of memory from a data structure including the plurality of subportions of memory using the weighted subportion identifier.

14. The non-transitory computer-readable storage medium of claim 13, wherein the defectivity information is estimated read window budgets for the plurality of subportions of memory.

15. A system comprising:

a plurality of memory devices; and a processing device, operatively coupled with the plurality of memory devices, to:

determine a read counter for a portion of memory of a memory device satisfies a read threshold;

select, in response to the read counter satisfying the read threshold, a weighted subportion identifier for the portion of memory, wherein the weighted subportion identifier is selected probabilistically, a probability of selection based on defectivity information for a plurality of subportions of memory of the portion of memory;

determine a subportion of memory of the plurality of subportions using the weighted subportion identifier;

perform a data validity scan on the subportion of memory;

determine a risk factor for the portion of memory using a result of the data validity scan;

determine whether the risk factor satisfies a refresh threshold; and perform a refresh operation on the portion of memory in response to the risk factor satisfying the refresh threshold.

16. The system of claim 15, wherein the processing device is further to:

determine whether a program erase cycle counter for the portion of memory satisfies a program erase threshold; and update the read threshold for the portion of memory in response to the program erase cycle counter satisfying the program erase threshold.

17. The system of claim 15, wherein the processing device is further to:

retrieve the read threshold for the portion of memory from a data structure for the memory device, wherein the data structure includes a plurality of read thresholds including the read threshold for the portion of memory, wherein another portion of memory is mapped to a read threshold of the plurality of read thresholds that has a different value than the read threshold for the portion of memory.

18. The system of claim 17, wherein the processing device is further to:

determine an updated read threshold for the portion of memory based on an estimated read window budget for the portion of memory; and update the data structure with the updated read threshold.

19. The system of claim 15, wherein determining the subportion of memory comprises:

determining a subportion identifier using a random process;

retrieving a risk weight using the subportion identifier, wherein the risk weight is based on the defectivity information;

determining the weighted subportion identifier using the subportion identifier and the risk weight; and retrieving the subportion of memory from a data structure including the plurality of subportions of memory using the weighted subportion identifier.

20. The system of claim 19, wherein the defectivity information is estimated read window budgets for the plurality of subportions of memory.

* * * * *